United States Patent
Yosui et al.

(10) Patent No.: US 10,278,289 B2
(45) Date of Patent: Apr. 30, 2019

(54) RESIN CIRCUIT BOARD AND RESIN CIRCUIT BOARD HAVING COMPONENT MOUNTED THEREON

(71) Applicant: Murata Manufacturing Co., Ltd., Nagaokakyo-shi, Kyoto-fu (JP)

(72) Inventors: Kuniaki Yosui, Nagaokakyo (JP); Shigeru Tago, Nagaokakyo (JP); Masaki Kawata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/903,064

(22) Filed: Feb. 23, 2018

(65) Prior Publication Data
US 2018/0182680 A1    Jun. 28, 2018

Related U.S. Application Data

(63) Continuation of application No. PCT/JP2016/075265, filed on Aug. 30, 2016.

(30) Foreign Application Priority Data

Sep. 2, 2015 (JP) ................................. 2015-172613

(51) Int. Cl.
*H05K 1/18* (2006.01)
*H05K 3/46* (2006.01)
(Continued)

(52) U.S. Cl.
CPC ............. *H05K 1/183* (2013.01); *H01L 23/12* (2013.01); *H01L 23/145* (2013.01);
(Continued)

(58) Field of Classification Search
None
See application file for complete search history.

(56) References Cited

U.S. PATENT DOCUMENTS

2002/0185303 A1*  12/2002  Takeuchi .............. H01L 21/568
                                                          174/256
2003/0049885 A1    3/2003   Iijima et al.
(Continued)

FOREIGN PATENT DOCUMENTS

JP    2002-111219 A    4/2002
JP    2003-068923 A    3/2003
(Continued)

OTHER PUBLICATIONS

Innovations for Decoupling Capacitors Embedded within the Circuit Board Substrate below the LSI Chip, TDK Corporation, downloaded from URL< https://product.tdk.com/info/en/techlibrary/developing/tfcp/index.html> on Oct. 1, 2018.Ma.*
(Continued)

*Primary Examiner* — J. E. Schoenholtz
(74) *Attorney, Agent, or Firm* — Keating & Bennett, LLP

(57) ABSTRACT

A resin circuit board includes a multilayer body, mounting land conductors, and second components. The multilayer body includes thermoplastic resin layers laminated together. The mounting land conductors are provided on a front surface of the multilayer body, and terminal conductors of a first component are bonded to the mounting land conductors by a thermal bonding method. The second components are disposed in the multilayer body and each has a modulus of elasticity greater than that of the multilayer body. When the multilayer body is seen in plan view, the second components are arranged such that a straight line connecting the second components passes through the center of gravity of the first component and such that the second components are superposed with the mounting land conductors.

15 Claims, 6 Drawing Sheets

(51) Int. Cl.
*H01L 23/12* (2006.01)
*H01L 23/14* (2006.01)
*H01L 23/50* (2006.01)
*H01L 23/498* (2006.01)

(52) U.S. Cl.
CPC .. *H01L 23/49822* (2013.01); *H01L 23/49827* (2013.01); *H01L 23/50* (2013.01); *H05K 1/18* (2013.01); *H05K 1/182* (2013.01); *H05K 3/46* (2013.01); *H01L 2224/16225* (2013.01)

(56) References Cited

U.S. PATENT DOCUMENTS

| | | | |
|---|---|---|---|
| 2005/0116354 A1 | 6/2005 | Kashiwazaki | |
| 2005/0218489 A1* | 10/2005 | Satou | H01L 23/49575 257/678 |
| 2012/0012369 A1* | 1/2012 | Kato | H01L 23/49822 174/254 |
| 2013/0213699 A1* | 8/2013 | Chisaka | H05K 1/186 174/255 |
| 2013/0242517 A1* | 9/2013 | Fujidai | H01L 23/49822 361/762 |
| 2014/0321069 A1* | 10/2014 | Gouchi | H05K 1/16 361/728 |
| 2016/0005543 A1* | 1/2016 | Wada | H01G 4/30 361/301.4 |

FOREIGN PATENT DOCUMENTS

| | | | |
|---|---|---|---|
| JP | 2005-183924 A | 7/2005 | |
| JP | 3909772 B2 | 4/2007 | |
| JP | 2008-244030 A | 10/2008 | |
| JP | 2013-642164 A | 2/2013 | |
| JP | WO 2013187117 A1 * | 12/2013 | ............... H05K 1/16 |
| WO | 2013/187117 A1 | 12/2013 | |

OTHER PUBLICATIONS

Young's Modulus—Tensile and Yield Strength for common Materials, downloaded from URL<https://www.engineeringtoolbox.com/young-modulus-d_417.html> on Oct. 1, 2018.*

Material: Barium Titanate (BaTiO3), bulk, downloaded from URL<https://www.memsnet.org/material/bariumtitanatebatio3bulk/> on Oct. 1, 2018.*

Official Communication issued in International Patent Application No. PCT/JP2016/075265, dated Nov. 22, 2016.

Official Communication issued in Japanese Patent Application No. 2017-538032, dated Sep. 25, 2018.

* cited by examiner

RESIN CIRCUIT BOARD AND RESIN CIRCUIT BOARD HAVING COMPONENT MOUNTED THEREON

CROSS REFERENCE TO RELATED APPLICATIONS

This application claims the benefit of priority to Japanese Patent Application No. 2015-172613 filed on Sep. 2, 2015 and is a Continuation Application of PCT Application No. PCT/JP2016/075265 filed on Aug. 30, 2016. The entire contents of each application are hereby incorporated herein by reference.

BACKGROUND OF THE INVENTION

1. Field of the Invention

The present invention relates to a resin circuit board that includes a component mounted on a surface thereof and circuits provided on the surface and inside thereof and that is made of a material having flexibility.

2. Description of the Related Art

In the related art, resin circuit boards including electronic components mounted thereon have often been used in various electronic devices. For example, in the configuration described in Japanese Patent No. 3909772, a semiconductor bare chip is mounted on a surface of a flexible board made of a thermoplastic resin. The semiconductor bare chip is bonded to the flexible board by ultrasonic bonding.

In the case of a flexible board having thermoplasticity, it is difficult to use a bonding method, such as reflow soldering, that is performed by heating the entire board. This is because, if a bonding method that is performed by heating the entire board is used, there is a probability that the flexible board will soften or melt and will become deformed. Even in the case of a partial bonding method, which is performed by partially heating and pressurizing a resin circuit board, instead of heating the entire resin circuit board, or in the case of ultrasonic bonding, a resin portion of a resin circuit board will partially soften. In addition, in the case of ultrasonic bonding, ultrasonic vibration is dispersed due to the flexibility of the flexible board, and this makes it difficult to perform sufficient ultrasonic bonding. For these reasons, a bonding failure is likely to occur between an electronic component and a resin circuit board.

SUMMARY OF THE INVENTION

Preferred embodiments of the present invention provide resin circuit boards that are made of thermoplastic material and on which a component is able to be securely mounted with certainty.

A resin circuit board according to a preferred embodiment of the present invention includes a multilayer body, a plurality of mounting land conductors, and a plurality of second components. The multilayer body includes a plurality of resin layers each having thermoplasticity, the resin layers being laminated together. The mounting land conductors are conductor patterns that are provided on a front surface of the multilayer body and to which terminal conductors of the first component are bonded by ultrasonic bonding. The second components are disposed in the multilayer body and each has a modulus of elasticity greater than that of each of the resin layers. When the multilayer body is viewed in plan view, the plurality of second components are arranged such that a straight line connecting the plurality of second components passes through the center of gravity of the first component and such that the second components are respectively superposed with the mounting land conductors.

With this configuration, when the first component is bonded to the resin circuit board, the strength of a bonding region is ensured by the plurality of second components. As a result, the first component is reliably mounted onto the mounting land conductors.

In addition, it is preferable that a resin circuit board according to a preferred embodiment of the present invention has the following configuration. The plurality of second components preferably are passive circuit chip components. The plurality of second components are connected to circuit conductors of the multilayer body by interlayer connection conductors. The interlayer connection conductors are disposed on the second components so as to be located on the side opposite to the side on which the mounting land conductors are disposed.

With this configuration, the influence of changes in the shapes of the interlayer connection conductors when the first component is bonded to the resin circuit board is reduced.

In addition, in a resin circuit board according to a preferred embodiment of the present invention, it is preferable that the plurality of second components be arranged at the same or substantially the same position in the height direction of the multilayer body.

With this configuration, a force is uniformly applied to the plurality of mounting land conductors.

In addition, in a resin circuit board according to a preferred embodiment of the present invention, it is preferable that the plurality of second components be positioned closer to the front surface of the multilayer body than the rear surface of the multilayer body.

With this configuration, the thickness of the resin layer disposed between the mounting land conductors and the plurality of second components is small, and the influence of deformation that occurs in the resin layer during a bonding operation is reduced.

In addition, in a resin circuit board according to a preferred embodiment of the present invention, it is preferable that the plurality of second components be disposed in one of the plurality of resin layers, which are included in the multilayer body, the one resin layer being the second layer from the front surface.

With this configuration, the thickness of the resin layer disposed between the mounting land conductors and the plurality of second components is the thickness of a single resin layer, and the influence of deformation that occurs in the resin layer during a bonding operation is reduced while the second components are built in the multilayer body.

A resin circuit board including a component mounted thereon according to a preferred embodiment of the present invention includes a multilayer body, a plurality of mounting land conductors, a first component, and a plurality of second components. The multilayer body includes a plurality of resin layers each having thermoplasticity, the resin layers being laminated together. The plurality of mounting land conductors are provided on a front surface of the multilayer body. The first component includes terminal conductors each of which is mounted on a corresponding one of the mounting land conductors. The plurality of second components are disposed in the multilayer body and each of which has a modulus of elasticity greater than a modulus of elasticity of each of the resin layers. Each of the terminal conductors is connected to the corresponding mounting land conductor with an ultrasonically-bonded portion interposed between the terminal conductor and the mounting land conductor.

With this configuration, when the first component is bonded to the resin circuit board, the strength of a bonding region is ensured by the plurality of second components. As a result, the first component is reliably mounted on the mounting land conductors.

In addition, in a resin circuit board including a component mounted thereon according to a preferred embodiment of the present invention, it is preferable that the first component be a high-frequency integrated circuit and that the second components be capacitors that are electrically connected to the first component.

With this configuration, the second components enable the first component to be reliably mounted on the mounting land conductors, and a structure to reduce noise of the first component is provided.

According to preferred embodiments of the present invention, resin circuit boards that are made of thermoplastic material and on which electronic components are able to be securely mounted with certainty are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
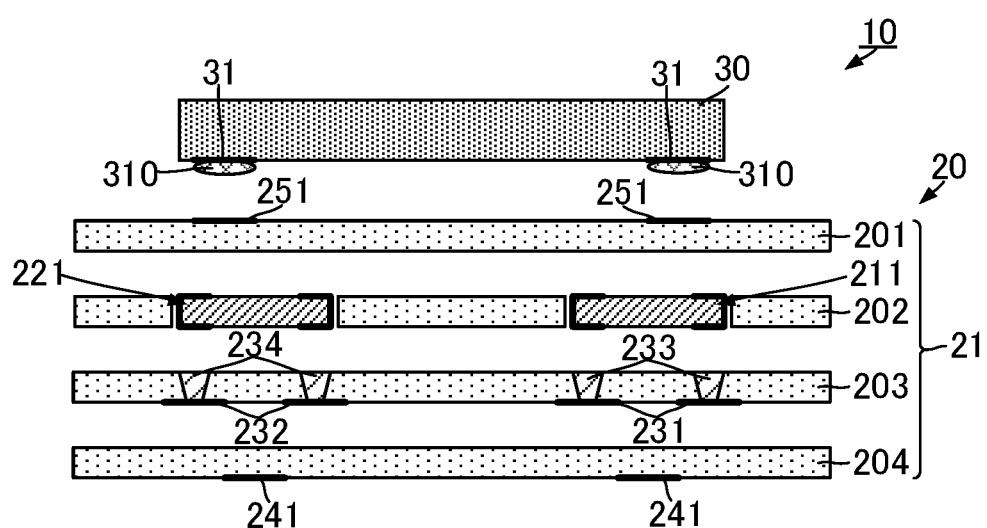
FIG. 1 is an exploded cross-sectional side view illustrating a configuration of a resin circuit board including components mounted thereon according to a first preferred embodiment of the present invention.
Figure 2:
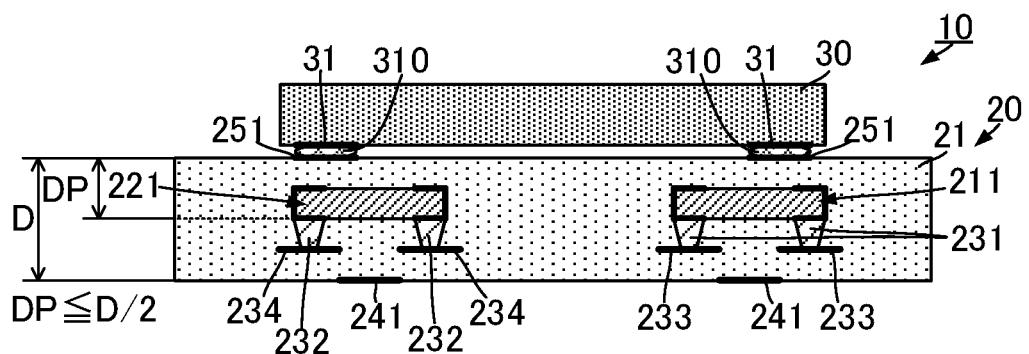
FIG. 2 is a cross-sectional side view illustrating the configuration of the resin circuit board including components mounted thereon according to the first preferred embodiment of the present invention.
Figure 3:
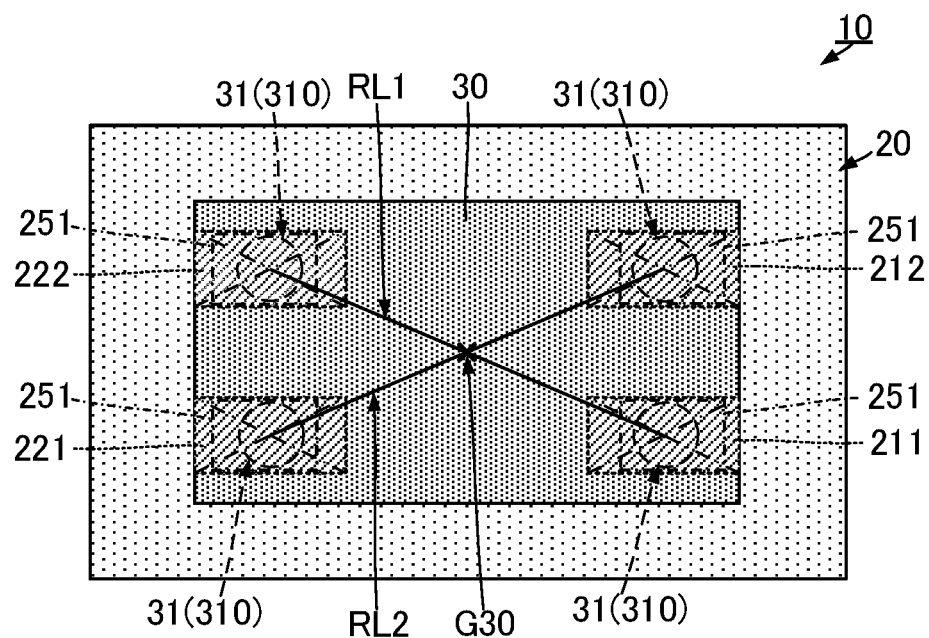
FIG. 3 is a plan view illustrating a concept of component arrangements on and in the resin circuit board including components mounted thereon according to the first preferred embodiment of the present invention.

A resin circuit board and a resin circuit board including components mounted thereon according to a first preferred embodiment of the present invention will be described with reference to the drawings. FIG. 1 is an exploded cross-sectional side view illustrating a configuration of a resin circuit board including components mounted thereon according to the first preferred embodiment of the present invention. FIG. 2 is a cross-sectional side view illustrating the configuration of the resin circuit board including components mounted thereon according to the first preferred embodiment of the present invention. FIG. 3 is a plan view illustrating a concept of component arrangements on and in the resin circuit board including components mounted thereon according to the first preferred embodiment of the present invention.

As illustrated in FIG. 1 and FIG. 2, a resin circuit board 10 including components mounted thereon (hereinafter referred to as "component-mounted resin circuit board 10") includes a resin circuit board 20 and a first component 30.

The first component 30 is preferably, for example, a semiconductor chip component including a high-frequency integrated circuit (IC) provided therein, and a plurality of terminal conductors 31 are provided on one main surface of the first component 30. The first component 30 preferably has a rectangular or substantially rectangular shape when viewed in plan view.

The plurality of terminal conductors 31 are provided and arranged on the one the main surfaces. For example, in the example illustrated in FIG. 3, the plurality of terminal conductors 31 are arranged in two columns and two rows when the first component 30 is viewed in plan view. The plurality of terminal conductors 31 are arranged in the vicinity of side surfaces of the first component 30. Metal bumps 310 (e.g., solder bumps, gold bumps, or the like) are provided on the terminal conductors 31.

The resin circuit board 20 includes a multilayer body 21 and second components 211, 212, 221, and 222. The multilayer body 21 includes a plurality of resin layers 201, 202, 203, and 204 that are laminated together. The plurality of resin layers 201, 202, 203, and 204 are preferably made of, for example, a thermoplastic resin and include a liquid crystal polymer as a main material.

A plurality of mounting land conductors 251 are provided on the front surface of the multilayer body 21, that is, the front surface of the resin layer 201. The plurality of mounting land conductors 251 are preferably conductor patterns each having a rectangular or substantially rectangular shape, for example. The plurality of mounting land conductors 251 are preferably arranged in the same or substantially the same pattern as that of the terminal conductors 31 of the first component 30, which are mounted on the plurality of mounting land conductors 251. A plurality of outer connection conductors 241 are provided on the rear surface of the multilayer body 21, that is, the rear surface of the resin layer 204.

The second components 211, 212, 221, and 222 are made of a material having a modulus of elasticity greater than that of the material of the resin layers 201, 202, 203, and 204. For example, the second components 211, 212, 221, and 222 are preferably passive circuit elements such as mountable capacitors. The second components 211, 212, 221, and 222 are disposed in the multilayer body 21. More specifically, as illustrated in FIG. 1, the second components 211, 212, 221, and 222 are preferably aligned with the resin layer 202 at the same or substantially the same position in the height direction of the multilayer body 21. In addition, as illustrated in FIG. 3, the second components 211, 212, 221, and 222 are preferably superposed with the plurality of mounting land conductors 251 when the resin circuit board 20 is viewed in plan view.

Each of the second components 211, 212, 221, 222 is respectively connected to one of the conductor patterns 233, 234 (circuit conductor) located between the resin layer 203 and the resin layer 204 via the interlayer connection conductors 231 or the interlayer connection conductor 232 provided in or on the resin layer 203.

The first component 30 is mounted on the front surface of the multilayer body 21, which has the above-described configuration. In this case, each of the terminal conductors 31 of the first component 30 is ultrasonically bonded to a corresponding one of the mounting land conductors 251. An interface between each of the terminal conductors 31 and the corresponding mounting land conductor 251, which are ultrasonically bonded together, corresponds to an ultrasonically-bonded portion according to a preferred embodiment of the present invention.

Here, the second components 211, 212, 221, and 222 are preferably located at positions at which the following condition is satisfied. When the component-mounted resin circuit board 10 is viewed in plan view, a straight line connecting two positions among the positions at which the second components 211, 212, 221, and 222 are disposed passes through the center of gravity G30 of the first component 30. In this case, at least one combination among all of the combinations of two positions defines a straight line that passes through the center of gravity G30 of the first component 30. For example, in the example illustrated in FIG. 3, when the component-mounted resin circuit board 10 is viewed in plan view, a straight line RL1 connecting a given point in a region in which the second component 211 is disposed and a given point in a region in which the second component 222 is disposed passes through the center of gravity G30 of the first component 30. In addition, when the component-mounted resin circuit board 10 is viewed in plan view, a straight line RL2 connecting a given point in a region in which the second component 221 is disposed and a given point in a region in which the second component 212 is disposed passes through the center of gravity G30 of the first component 30. In other words, the second components 211, 212, 221, and 222 are arranged so as not to be offset with respect to the center of gravity G30 in a particular direction.

Note that, when describing only the resin circuit board 20, the above condition may be rephrased as follows: when the resin circuit board 20 is viewed in plan view, a straight line connecting two positions among the positions at which the second components 211, 212, 221, and 222 are disposed passes through a geometric center of the positions at which the plurality of mounting land conductors 251 are disposed.

By providing this configuration, the second components 211, 212, 221, and 222, each of which has a modulus of elasticity greater than that of the multilayer body 21, define bases when the first component 30 is ultrasonically bonded to the resin circuit board 20, and the bonding stability at the positions of the mounting land conductors 251 during the ultrasonic bonding are improved. In addition, by providing the second components 211, 212, 221, and 222 in a pattern such as that described above, a likelihood of an uneven application of ultrasonic vibration to the plurality of mounting land conductors 251 when the ultrasonic bonding is performed is reduced. As a result, stable ultrasonic vibration is applied to the plurality of mounting land conductors 251. Therefore, the terminal conductors 31 of the first component 30 are able to be reliably bonded to the mounting land conductors 251 of the resin circuit board 20, and the bonding strength therebetween is improved.

The second components 211, 212, 221, and 222 are preferably aligned at the same or substantially the same position in the height direction of the resin circuit board 20. A distance DP from the front surface of the resin circuit board 20 to each of the second components 211, 212, 221, and 222 in the height direction of the resin circuit board 20 is preferably about half of a height D of the resin circuit board 20 or smaller. By providing this configuration, the thickness of the resin layer disposed between the second components 211, 212, 221, and 222 and the mounting land conductors 251 is reduced. As the thickness of a resin layer decreases, deformation that occurs in the resin layer during a bonding operation is reduced. Consequently, the influence of deformation that occurs in the resin layer during a bonding operation is reduced, and the bonding strength is further improved.

In this case, as illustrated in FIG. 1, the second components 211, 212, 221, and 222 are preferably provided in the resin layer 202 among the plurality of resin layers 201, 202, 203, and 204 included in the multilayer body 21, so that the resin layer 201 is the only resin layer positioned between the second components 211, 212, 221, and 222 and the mounting land conductors 251. Thus, the thickness of the resin layer positioned between the second components 211, 212, 221, and 222 and the mounting land conductors 251 is preferably set to include only the thickness of the resin layer 201. The influence of deformation that occurs in the resin layer during a bonding operation is reduced, and the bonding strength is further improved.

As illustrated in FIG. 1 and FIG. 2, the interlayer connection conductors 231, 232 connecting the second components 211, 212, 221 and 222 to the conductor patterns 233, 234 in the multilayer body 21 are disposed on surfaces of the second components 211, 212, 221, and 222, the surfaces being opposite to surfaces of the second components 211, 212, 221, and 222 that face the mounting land conductors 251. As a result, the influence of changes in the shapes of the interlayer connection conductors 231 and 232 when the first component 30 is bonded to the resin circuit board 20 is reduced. Therefore, the bonding strength between the terminal conductors 31 and the mounting land conductors 251 when the first component 30 is mounted onto the resin circuit board 20 is further improved and stabilized.

Note that a component-mounted resin circuit board that has a configuration as described above may preferably be manufactured by the following non-limiting example of a manufacturing process.

First, the plurality of resin layers 201, 202, 203, and 204 are prepared. Each of the plurality of resin layers 201, 202, 203, and 204 has a desired conductor pattern formed thereon or therein, the desired conductor pattern being formed of, for example, a metal foil such as a copper foil. For example, the mounting land conductors 251 are formed on the front surface of the resin layer 201. The resin layer 202 includes holes in which the second components 211, 212, 221, and 222 are to be accommodated.

Next, the resin layers 201, 202, 203, 204 are stacked on top of one another and bonded together by being heated and pressurized. In this case, the resin layers 201, 202, 203, 204 are stacked on top of one another and bonded together by being heated and pressurized in the state in which the second components 211, 212, 221, and 222 are accommodated in the holes of the resin layer 202. As a result, the resin circuit board 20 is formed.

Next, the first component 30 is mounted on the resin circuit board 20. More specifically, the terminal conductors 31 of the first component 30 are brought into contact with the mounting land conductors 251 of the resin circuit board 20, and the terminal conductors 31 are ultrasonically bonded to the mounting land conductors 251. As a result, the component-mounted resin circuit board 10 is provided.

Figure 4:
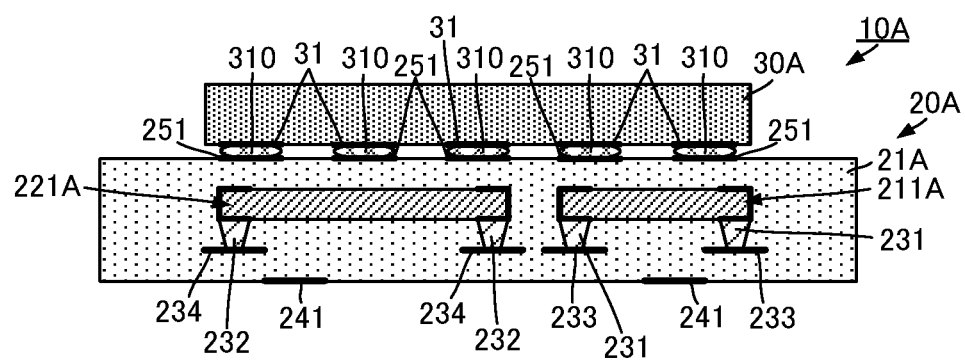
FIG. 4 is a cross-sectional side view illustrating a configuration of a resin circuit board including components mounted thereon according to a second preferred embodiment of the present invention.
Figure 5:
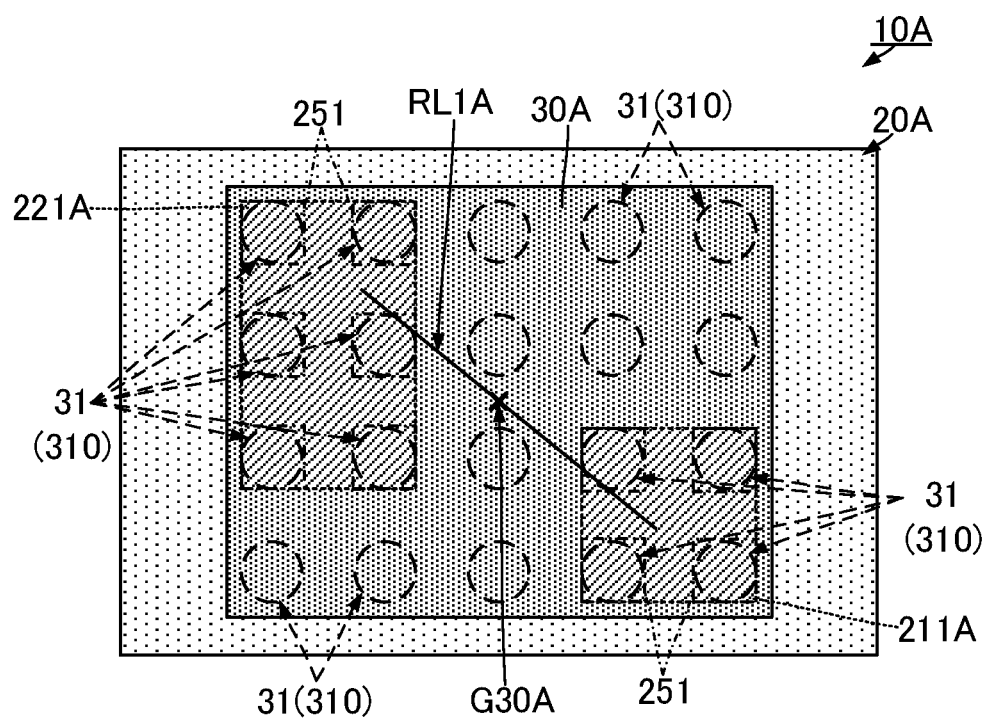
FIG. 5 is a plan view illustrating a concept of component arrangements on and in the resin circuit board including components mounted thereon according to the second preferred embodiment of the present invention.

A resin circuit board and a component-mounted resin circuit board according to a second preferred embodiment of the present invention will now be described with reference to the drawings. FIG. 4 is a cross-sectional side view illustrating the configuration of the component-mounted resin circuit board according to the second preferred embodiment of the present invention. FIG. 5 is a plan view illustrating a concept of component arrangements on and in the component-mounted resin circuit board according to the second preferred embodiment of the present invention.

In a component-mounted resin circuit board 10A according to the second preferred embodiment, the differences from the component-mounted resin circuit board 10 according to the first preferred embodiment are the arrangement pattern of the terminal conductors 31 of a first component 30A, the arrangement pattern of the mounting land conductors 251 of a resin circuit board 20A, and the arrangement pattern of second components 211A and 221A. The remainder of the basic configuration of the component-mounted resin circuit board 10A according to the second preferred embodiment is the same or substantially the same as that of the component-mounted resin circuit board 10 according to the first preferred embodiment.

As illustrated in FIG. 4 and FIG. 5, the plurality of terminal conductors 31 are disposed on one main surface of the first component 30A so as to be arranged over the entire or substantially the entire main surface. In the example illustrated in FIG. 5, the plurality of terminal conductors 31 are preferably two-dimensionally arranged in four columns and five rows, for example.

In the resin circuit board 20A, the plurality of mounting land conductors 251 are arranged on a front surface of the multilayer body 21A such that each of the plurality of mounting land conductors 251 corresponds to one of the plurality of terminal conductors 31.

As illustrated in FIG. 5, when the component-mounted resin circuit board 10A is viewed in plan view, the second components 211A and 221A are preferably disposed at positions diagonally opposite to each other in the first component 30A. In the example illustrated in FIG. 5, the second component 211A is positioned so as to be superposed with the four terminal conductors 31 in the vicinity of a first corner of the first component 30A. In contrast, the second component 221A is positioned so as to be superposed with the six terminal conductors 31 in the vicinity of a second corner, which is diagonally opposite to the first corner, of the first component 30A.

By providing this arrangement, when the component-mounted resin circuit board 10A is viewed in plan view, a straight line RL1A connecting a given point in a region in which the second component 211A is disposed and a given point in a region the second component 221A is disposed passes through the center of gravity G30A of the first component 30A. As a result, advantageous effects similar to those of the component-mounted resin circuit board 10 according to the first preferred embodiment are obtained, and the bonding strength between the terminal conductors 31 and the mounting land conductors 251 is improved and stabilized.

Note that, in each of the above-described preferred embodiments, although an arrangement has been described in which each of the second components is disposed so as to be superposed with one of the terminal conductors closest to one of the corners of the first component, the present invention is not limited to this arrangement, and the advantageous effects of the present invention can be obtained as long as a straight line connecting at least a pair of positions among the positions at which the second components are disposed passes through the center of gravity of the first component.

In addition, although the electrical circuit relationship between the first component and the second components has not been described in the above-described preferred embodiments, for example, when the first component and the second components are a high-frequency IC and capacitors, respectively, and these components are connected to one another so as to define an electrical circuit, the capacitors may preferably be used as noise reduction capacitors for the high-frequency IC, and the high-frequency IC is protected against noise. In this case, as described in the above preferred embodiments, the mounting land conductors and the second components are positioned close to each other, and thus, the distance between the capacitors and the high-frequency IC is small. Therefore, this arrangement is more effective in that the length of a routing conductor between the capacitors and the high-frequency IC is short and in that the influence of noise caused by the routing conductor is reduced.

In contrast, in each of the above-described preferred embodiments, it may be considered to increase the area of a single second component such that the second component is superposed with all of the terminal conductors 31 (mounting land conductors 251). However, as described in the above preferred embodiments, in the multilayer body 21, the flexibility of wiring is improved by arranging a plurality of second components such that each of the second components corresponds to one of the terminal conductors 31 (mounting land conductors 251) or such that each of the second components are superposed with a predetermined number, but not all, of the terminal conductors 31 (mounting land conductors 251). For example, a wiring line (a planar conductor pattern or an interlayer connection conductor) may also be routed in a region that is superposed with the first component when viewed in plan view and in which the plurality of second components are not arranged. Therefore, for example, the size of the component-mounted resin circuit board is reduced.

Note that, in the above description, although the height of each of the second components is preferably equal or substantially equal to the thickness of a single resin layer, the height of each of the second components may be equal or substantially equal to the sum of the thicknesses of a plurality of resin layers. In this case, cavities that accommodate the second components may be provided so as to extend across a plurality of resin layers.

Figure 6:
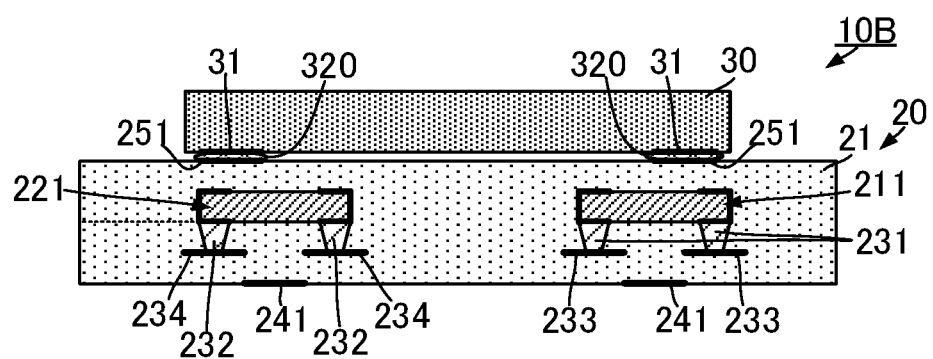
FIG. 6 is a cross-sectional view illustrating another bonding structure according to a preferred embodiment of the present invention.

In addition, as illustrated in FIG. 6, an anisotropic conductive film may be used to bond each of the terminal conductors and a corresponding one of the mounting land conductors together. FIG. 6 is a cross-sectional view illustrating another bonding structure according to a preferred embodiment of the present invention.

In a component-mounted resin circuit board 10B illustrated in FIG. 6, the difference from the component-mounted resin circuit board 10 according to the first preferred embodiment is that anisotropic conductive films 320 are preferably used, for example, instead of the metal bumps 310. The remainder of the configuration of the component-mounted resin circuit board 10B is preferably the same or similar to that of the component-mounted resin circuit board 10, and descriptions of similar components will be omitted.

As illustrated in FIG. 6, each of the terminal conductors 31 of the component 30 and a corresponding one of the mounting land conductors 251 of the resin circuit board 20 are bonded together by an anisotropic conductive film 320. As a non-limiting example of a specific manufacturing method, the anisotropic conductive films 320 are arranged so as to cover the terminal conductors 31 or the mounting land conductors 251. The component is mounted on the resin circuit board 20 such that the anisotropic conductive films 320 are brought into contact with the terminal conductors 31 and the mounting land conductors 251. In this state, hot pressing is performed on the anisotropic conductive films 320, so that the terminal conductors 31 and the corresponding mounting land conductors 251 are bonded together, that is, the component 30 and the resin circuit board 20 are bonded together.

As described above, even in a configuration in which anisotropic conductive films are used, the advantageous effects of the above-described preferred embodiments are obtained. Note that anisotropic conductive films may also be applied to the second preferred embodiment.

In addition, in the above description, although a case has been described in which the terminal conductors 31 each preferably have a circular or substantially circular shape when viewed in plan view, the shape of each of the terminal conductors 31 is not limited to a circular or substantially circular shape and may be a rectangular or substantially rectangular shape or other suitable shapes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin circuit board comprising:
   a multilayer body that includes a plurality of resin layers each having thermoplasticity, the plurality of resin layers being laminated together;
   a plurality of mounting land conductors that are provided on a front surface of the multilayer body and to which terminal conductors of a first component are bonded; and
   a plurality of second components that are disposed in the multilayer body and each of which has a modulus of elasticity greater than a modulus of elasticity of each of the plurality of resin layers; wherein
   the plurality of second components are directly disposed in a plurality of holes provided in at least one of the plurality of resin layers;
   when the multilayer body is seen in plan view, the plurality of second components are arranged such that a straight line connecting the plurality of second components passes through a center of gravity of the first component and such that the plurality of second components are superposed with the plurality of mounting land conductors;
   the plurality of second components are connected to circuit conductors of the multilayer body by interlayer connection conductors; and
   the interlayer connection conductors are not disposed between the second components and the mounting land conductors, but are disposed on one side of the second components opposite to another side of the second components on which the mounting land conductors are located.

2. The resin circuit board according to claim 1, wherein the plurality of second components are arranged at a same position or substantially a same position in a height direction of the multilayer body.

3. The resin circuit board according to claim 2, wherein the plurality of second components are positioned closer to the front surface of the multilayer body than to a rear surface of the multilayer body.

4. The resin circuit board according to claim 3, wherein the plurality of second components are disposed in or on one of the plurality of resin layers that is a second layer from the front surface of the multilayer body.

5. The resin circuit board according to claim 1, wherein the plurality of second components are arranged at a same position or substantially a same position in a height direction of the multilayer body.

6. The resin circuit board according to claim 5, wherein the plurality of second components are positioned closer to the front surface of the multilayer body than to a rear surface of the multilayer body.

7. The resin circuit board according to claim 6, wherein the plurality of second components are disposed in or on one of the plurality of resin layers that is a second layer from the front surface of the multilayer body.

8. A resin circuit board having a component mounted thereon comprising:
   a multilayer body that includes a plurality of resin layers each having thermoplasticity, the plurality of resin layers being laminated together;
   a plurality of mounting land conductors that are provided on a front surface of the multilayer body;
   a first component that includes terminal conductors each of which is mounted on a corresponding one of the mounting land conductors; and
   a plurality of second components that are disposed in the multilayer body and each of which has a modulus of elasticity greater than a modulus of elasticity of each of the plurality of resin layers; wherein
   the plurality of second components are directly disposed in a plurality of holes provided in at least one of the plurality of resin layers;
   when the multilayer body is seen in plan view, the plurality of second components are arranged such that a straight line connecting the plurality of second components passes through a center of gravity of the first component and such that the plurality of second components are superposed with the plurality of mounting land conductors;
   the plurality of second components are connected to circuit conductors of the multilayer body by interlayer connection conductors;
   the interlayer connection conductors are not disposed between the second components and the mounting land conductors, but are disposed on one side of the second components opposite to another side of the second components on which the mounting land conductors are located; and
   each of the terminal conductors is connected to the corresponding mounting land conductor with an ultrasonically-bonded portion or an anisotropic conductive portion interposed between the terminal conductor and the mounting land conductor.

9. The resin circuit board having a component mounted thereon according to claim 8, wherein
   the first component is a high-frequency integrated circuit; and
   the plurality of second components are capacitors that are electrically connected to the first component.

10. The resin circuit board having a component mounted thereon according to claim 8, wherein the plurality of second components are arranged at a same position or substantially a same position in a height direction of the multilayer body.

11. The resin circuit board having a component mounted thereon according to claim 10, wherein the plurality of second components are positioned closer to the front surface of the multilayer body than to a rear surface of the multilayer body.

12. The resin circuit board having a component mounted thereon according to claim 11, wherein the plurality of second components are disposed in or on one of the plurality of resin layers that is a second layer from the front surface of the multilayer body.

13. The resin circuit board having a component mounted thereon according to claim 8, wherein the plurality of second components are arranged at a same position or substantially a same position in a height direction of the multilayer body.

14. The resin circuit board having a component mounted thereon according to claim 13, wherein the plurality of second components are positioned closer to the front surface of the multilayer body than to a rear surface of the multilayer body.

15. The resin circuit board having a component mounted thereon according to claim 14, wherein the plurality of second components are disposed in or on one of the plurality of resin layers that is a second layer from the front surface of the multilayer body.

* * * * *